(12) United States Patent
Mayer et al.

(10) Patent No.: US 9,666,452 B2
(45) Date of Patent: May 30, 2017

(54) CHIP PACKAGES AND METHODS FOR MANUFACTURING A CHIP PACKAGE

(75) Inventors: Karl Adolf Dieter Mayer, Villach (AT); Guenter Tutsch, Saal/Do. (DE); Horst Theuss, Wenzenbach (DE); Manfred Engelhardt, Villach-Landskron (AT); Joachim Mahler, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 405 days.

(21) Appl. No.: 13/480,513

(22) Filed: May 25, 2012

(65) Prior Publication Data

US 2013/0313719 A1    Nov. 28, 2013

(51) Int. Cl.
| | |
|---|---|
| H01L 21/44 | (2006.01) |
| H01L 21/00 | (2006.01) |
| H01L 21/56 | (2006.01) |
| H01L 23/00 | (2006.01) |
| H01L 21/78 | (2006.01) |

(52) U.S. Cl.
CPC ............ *H01L 21/561* (2013.01); *H01L 21/78* (2013.01); *H01L 24/03* (2013.01); *H01L 24/94* (2013.01); *H01L 24/05* (2013.01); *H01L 24/06* (2013.01); *H01L 2224/03002* (2013.01); *H01L 2224/05009* (2013.01); *H01L 2224/0566* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05684* (2013.01); *H01L 2224/06181* (2013.01); *H01L 2224/49175* (2013.01); *H01L 2224/92247* (2013.01); *H01L 2224/94* (2013.01); *H01L 2924/12032* (2013.01); *H01L 2924/1301* (2013.01); *H01L 2924/1305* (2013.01); *H01L 2924/1306* (2013.01); *H01L 2924/13034* (2013.01); *H01L 2924/13091* (2013.01); *H01L 2924/3025* (2013.01)

(58) Field of Classification Search
USPC .......................... 438/114, 3, 124, 724, 612
See application file for complete search history.

(56) References Cited

U.S. PATENT DOCUMENTS

| | | | |
|---|---|---|---|
| 8,258,006 B2 * | 9/2012 | Wood .................. | H01L 25/0657 438/106 |
| 2003/0148597 A1 | 8/2003 | Tan et al. | |
| 2004/0126928 A1 * | 7/2004 | Kinsman et al. ............. | 438/108 |
| 2005/0101116 A1 | 5/2005 | Tseng | |
| 2006/0154447 A1 | 7/2006 | Kushima et al. | |
| 2008/0029895 A1 * | 2/2008 | Hu et al. ......................... | 257/762 |
| 2008/0179611 A1 * | 7/2008 | Chitnis et al. .................. | 257/98 |
| 2008/0230913 A1 | 9/2008 | Huang et al. | |

(Continued)

*Primary Examiner* — Dale E Page
*Assistant Examiner* — Wilner Jean Baptiste
(74) *Attorney, Agent, or Firm* — Viering, Jentschura & Partner mbB

(57) ABSTRACT

A method for manufacturing a chip package is provided. The method including: holding a carrier including a plurality of dies; forming a separation between the plurality of dies by removing from the carrier one or more portions of the carrier between the plurality of dies; forming an encapsulation material in the removed one or more portions between the plurality of dies; separating the dies through the encapsulation material.

23 Claims, 14 Drawing Sheets

(56) References Cited

U.S. PATENT DOCUMENTS

| | | | |
|---|---|---|---|
| 2009/0227070 A1* | 9/2009 | Miyajima | 438/113 |
| 2010/0210071 A1* | 8/2010 | Mahler | H01L 21/4832 438/107 |
| 2010/0276769 A1* | 11/2010 | Theuss et al. | 257/421 |
| 2013/0037935 A1* | 2/2013 | Xue | H01L 21/76898 257/737 |

* cited by examiner

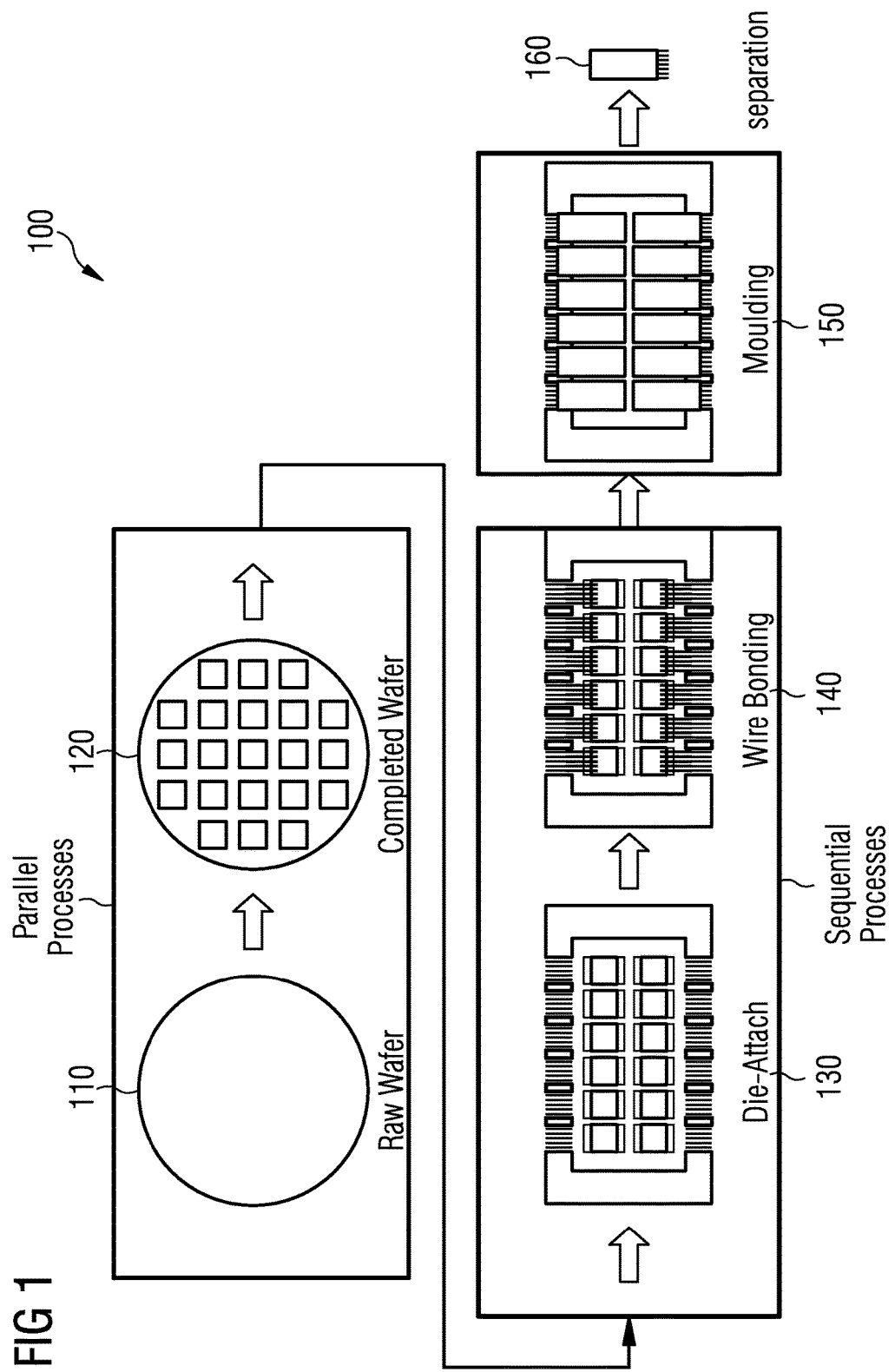

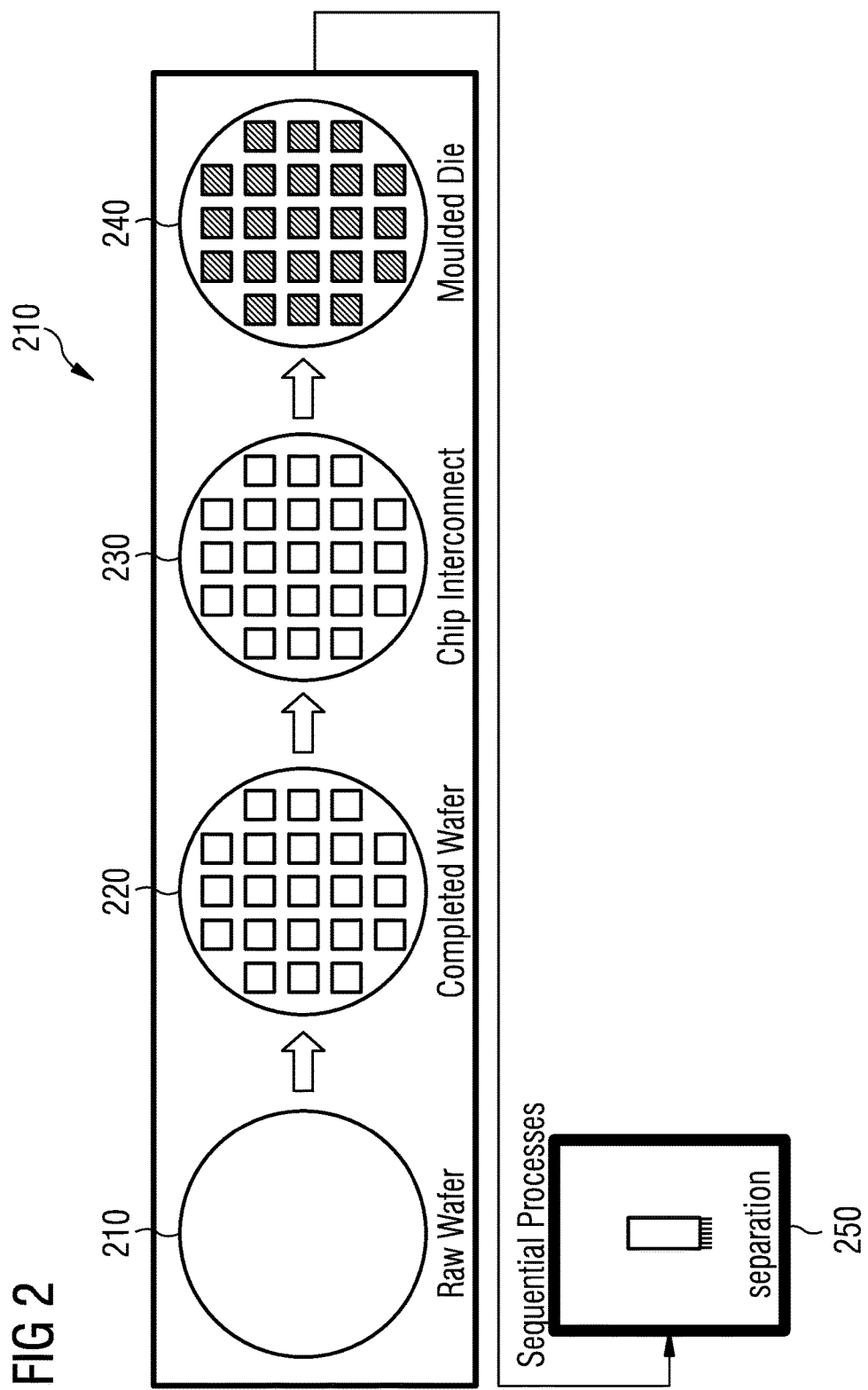

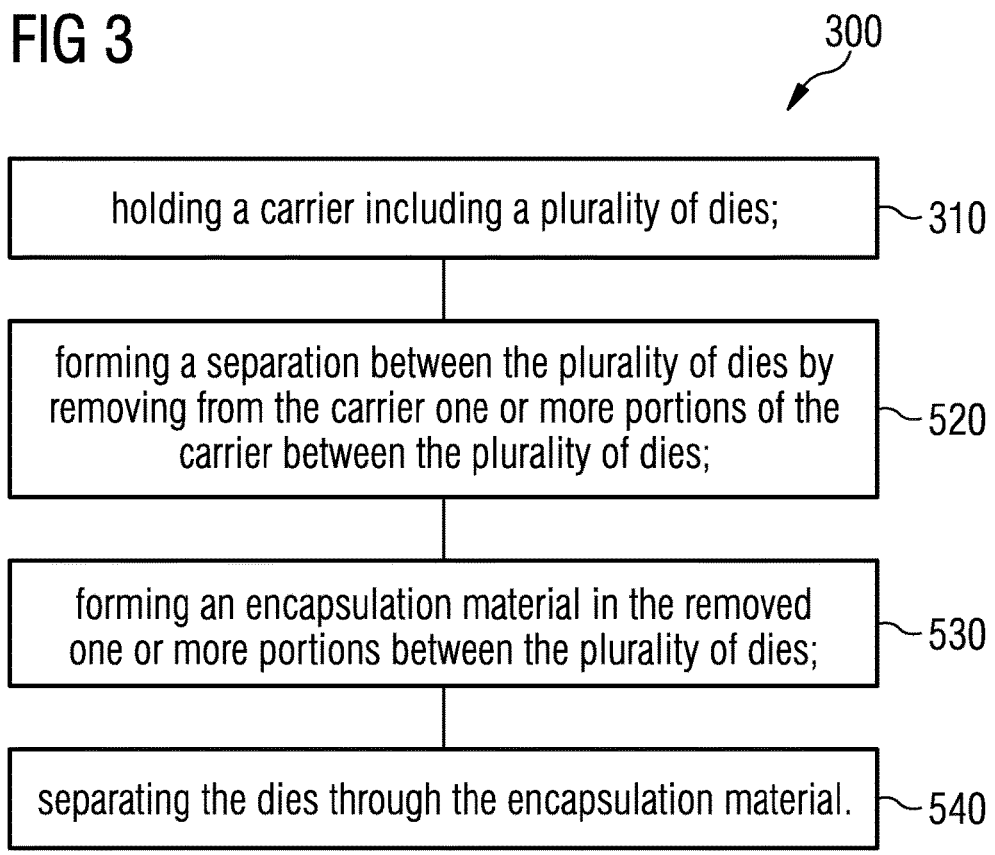

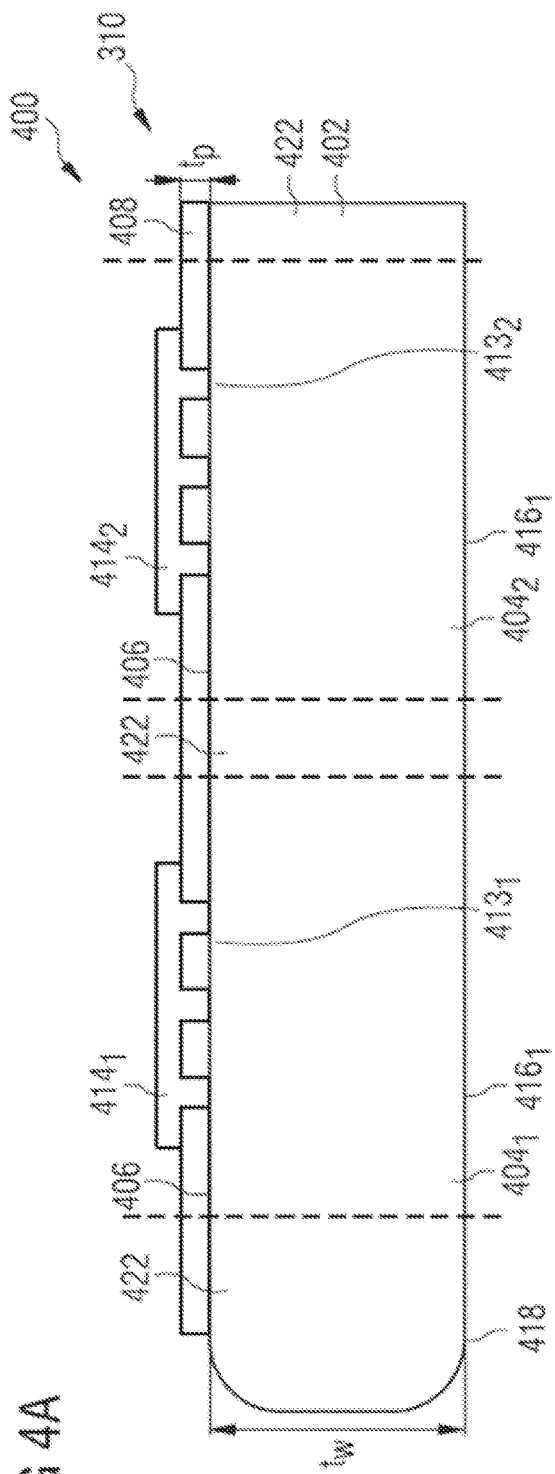
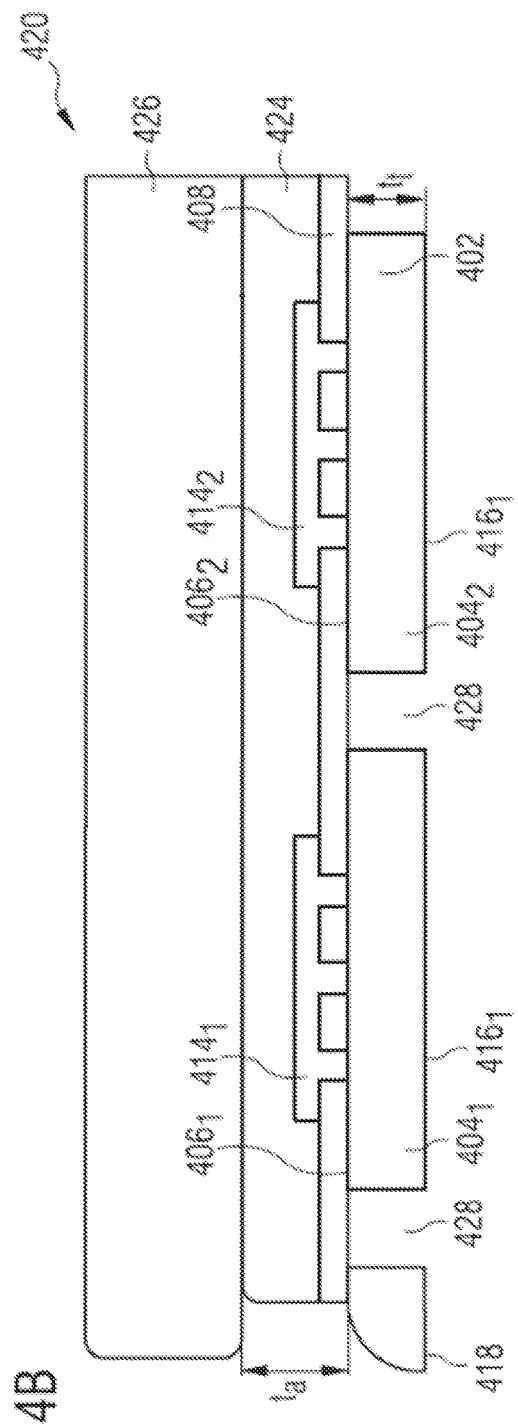
FIG 4A
FIG 4B

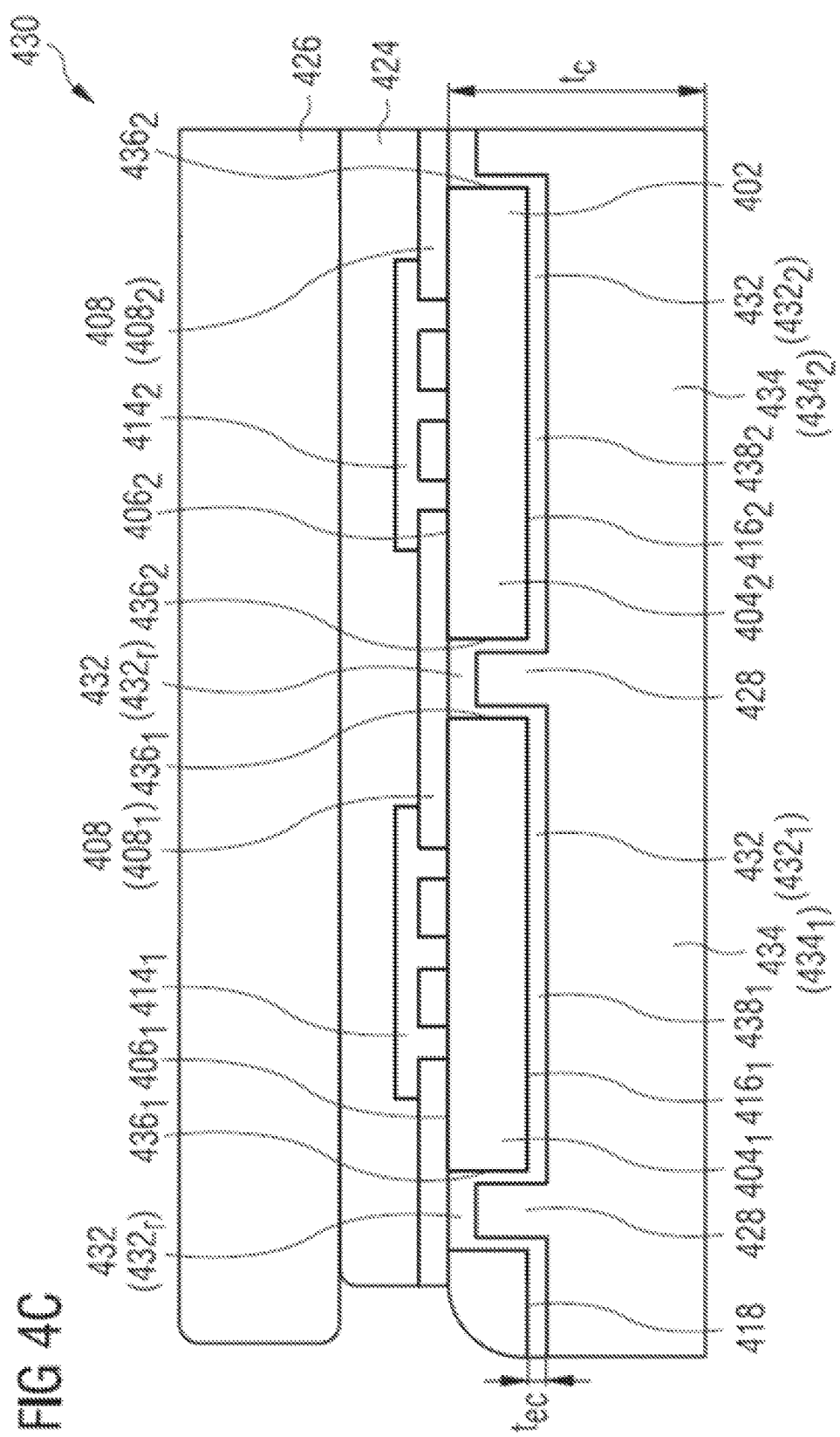

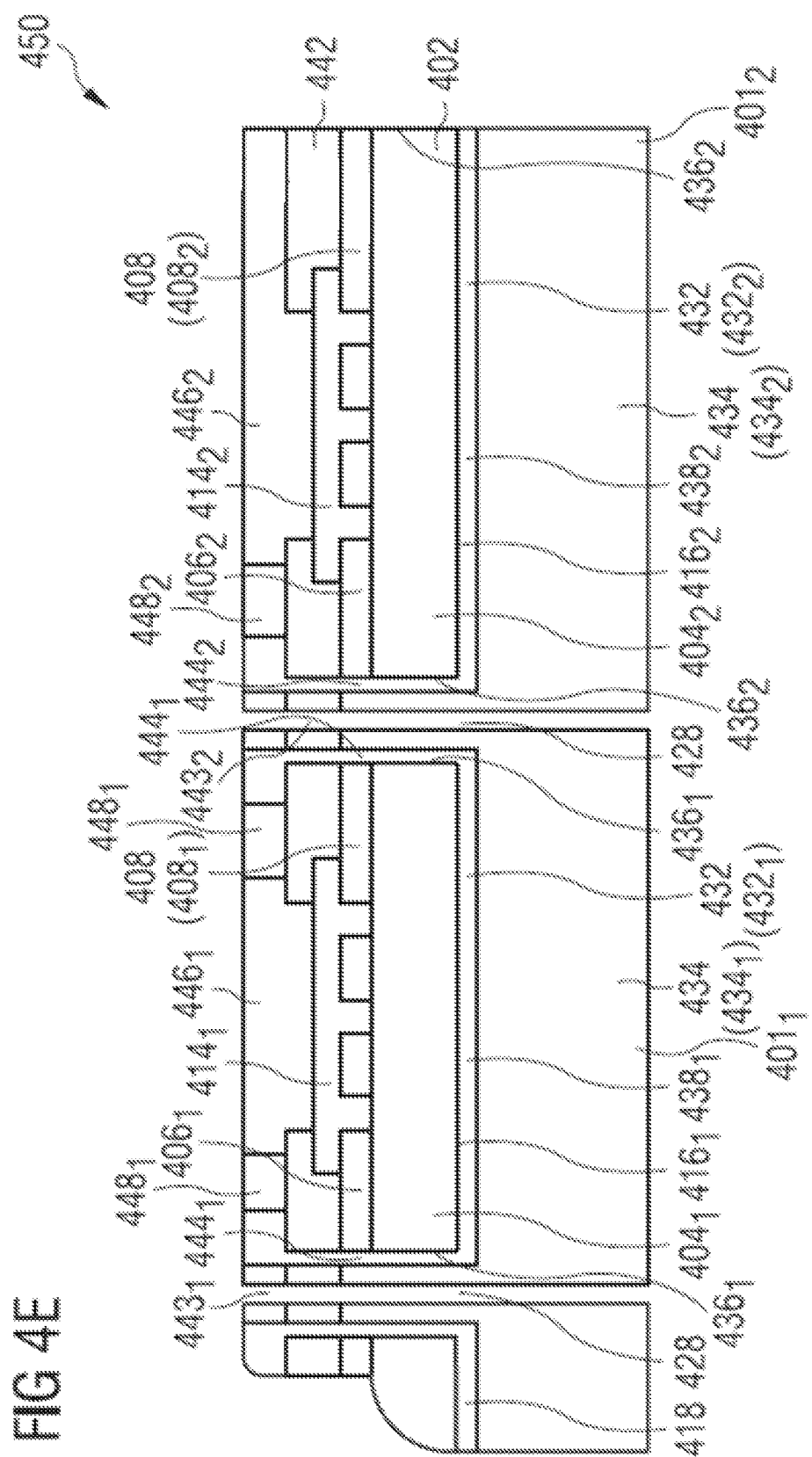

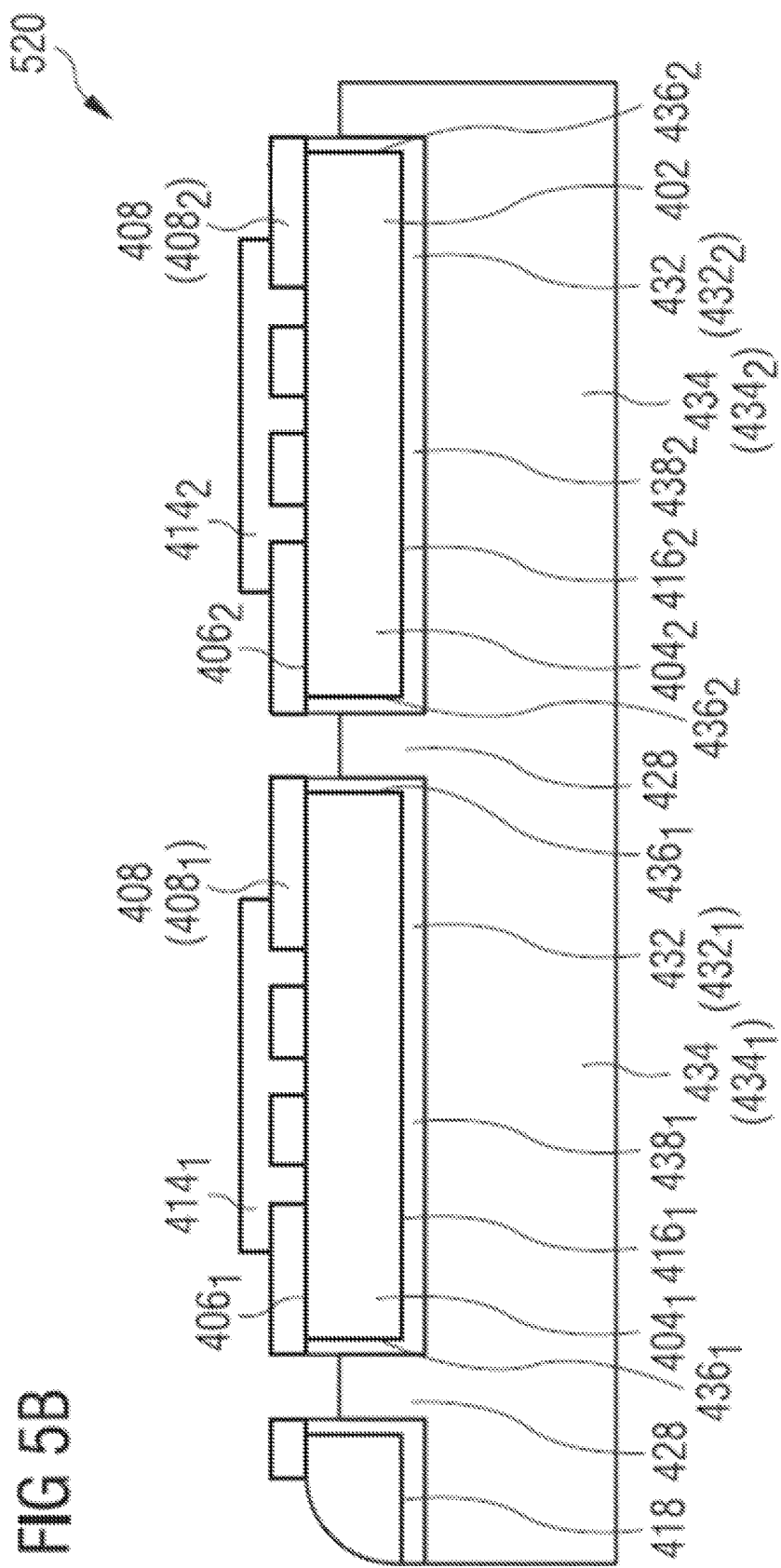

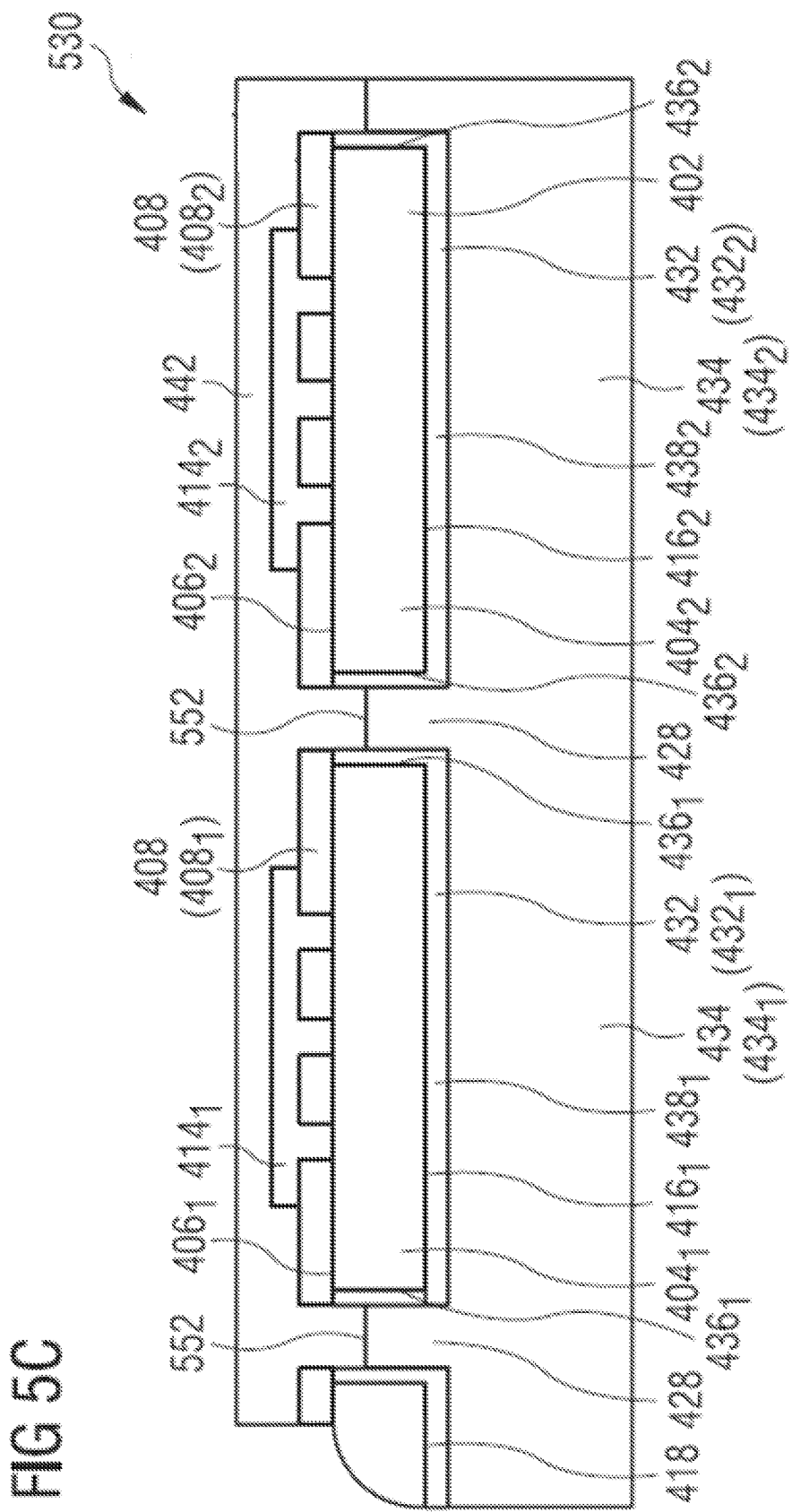

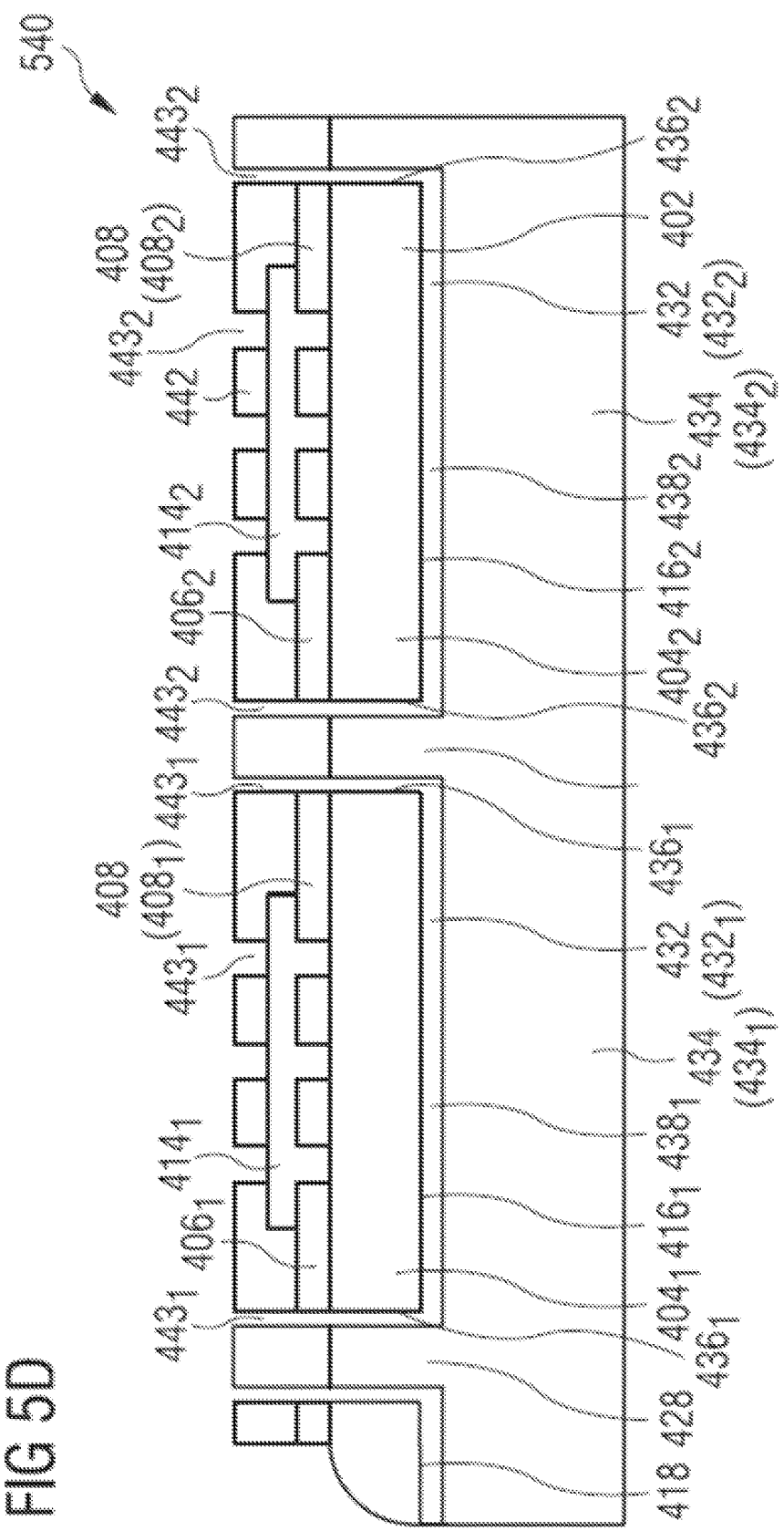

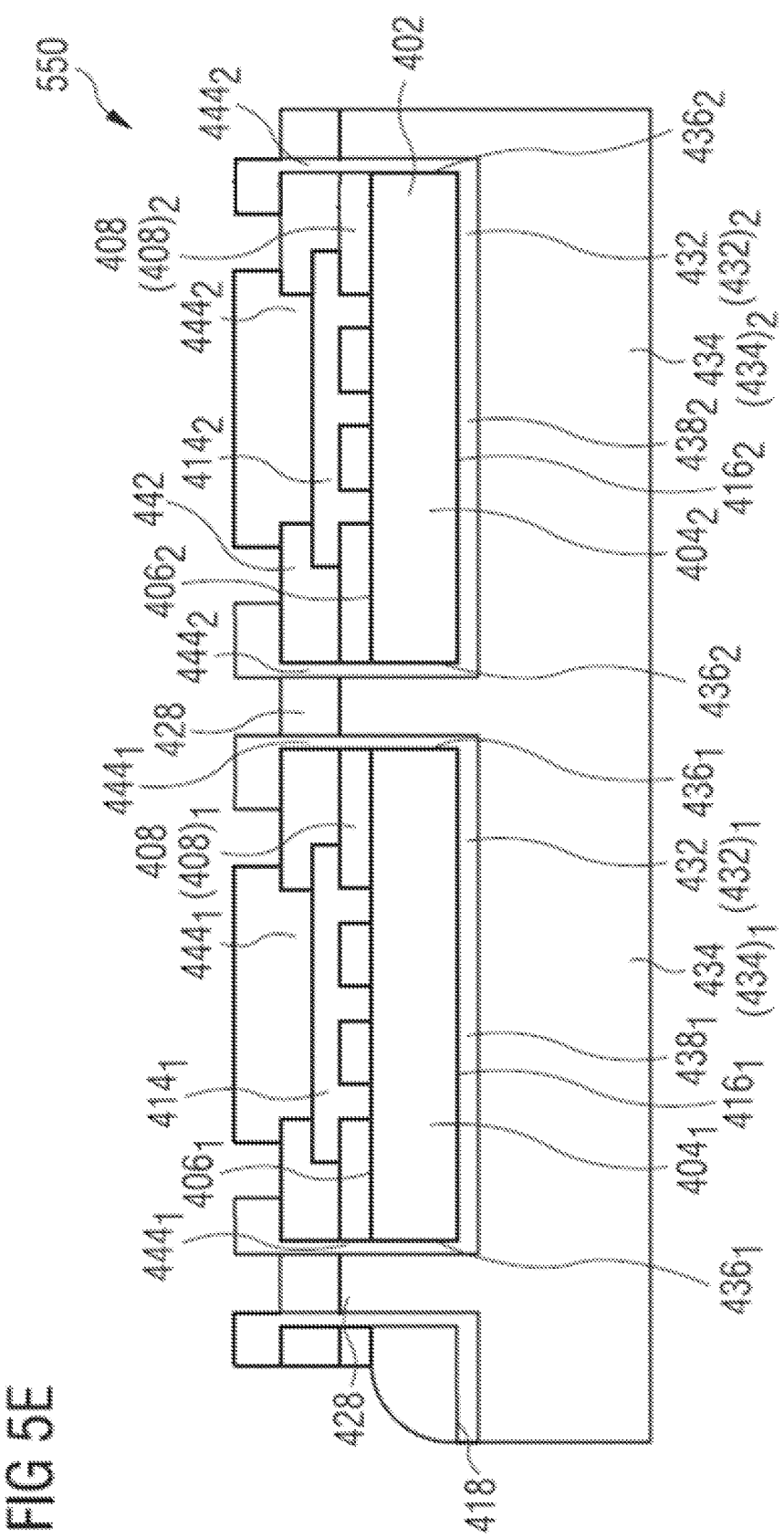

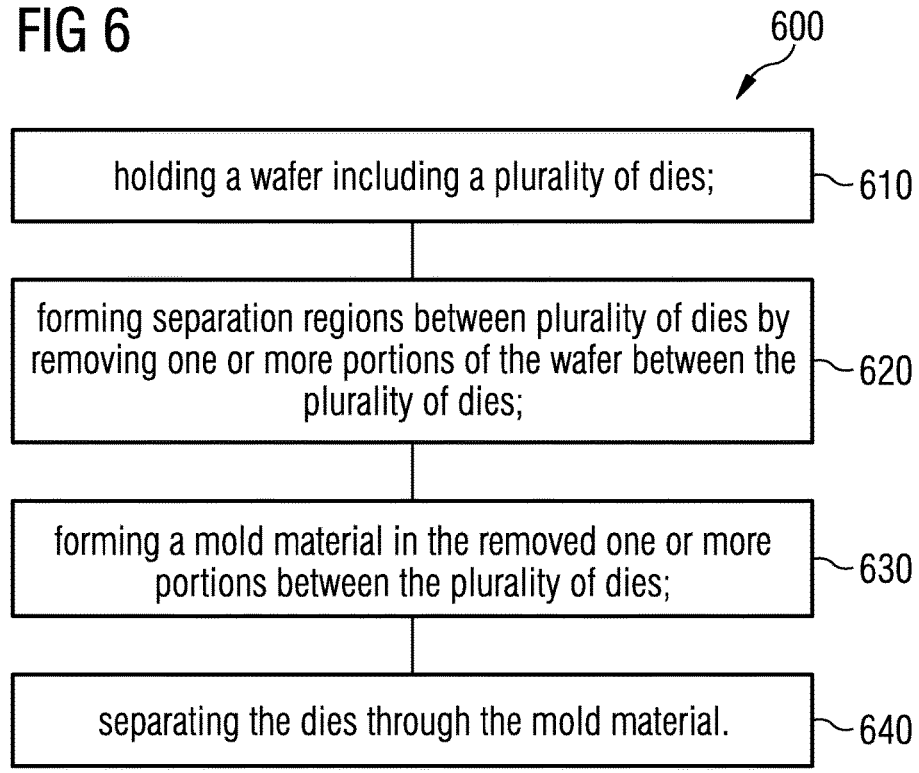
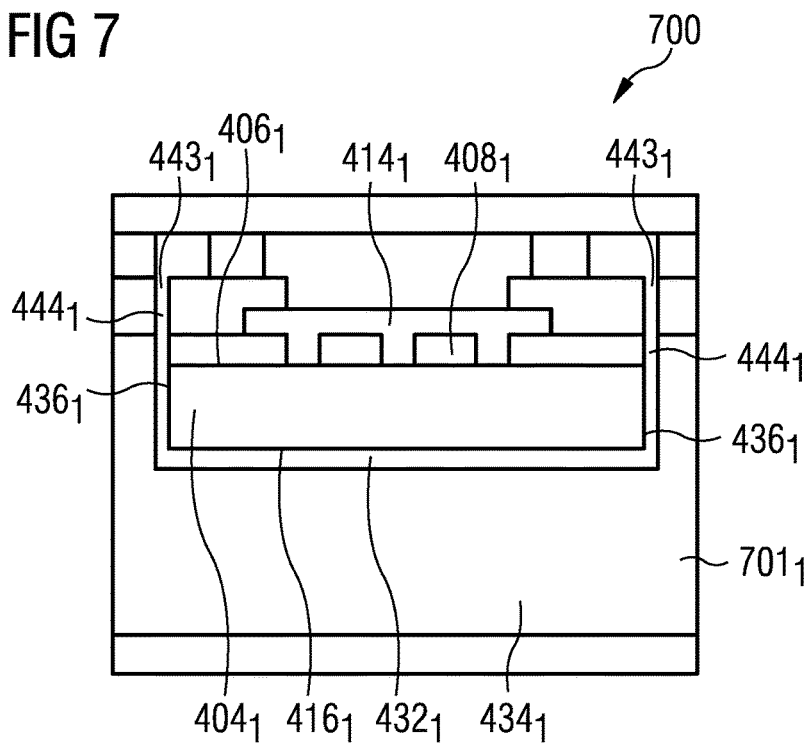

CHIP PACKAGES AND METHODS FOR MANUFACTURING A CHIP PACKAGE

TECHNICAL FIELD

Various embodiments relate generally to chip packages and methods for manufacturing a chip package.

BACKGROUND

In the field of assembly of semiconductor components, chip to leadframe connections and wire bonding processes may be carried out serially. These processes are very cost intensive. Producing small chips or components with many pads and many wire connections may contribute up to 90% of the value of the assembly process. Manufacturing processes for semiconductor components may usually take place in two parts. As shown in FIG. 1, in a first part, the chips may be produced on a raw silicon wafer (in 110). Therein, many chips (up to 100,000 per wafer) may be worked on in parallel (in 110, 120). In a second part, the silicon piece, e.g. the silicon wafer may be sawed, and subsequently, the individual chips may be constructed into chip packages, e.g. in a die attach process (in 130). One of the last processing steps, e.g. the wire bonding (in 140), are performed in sequential processes. For example, the dies may be wire bonded one at a time and/or one after the other, i.e. serially. Furthermore, the dies may be molded individually (in 150), e.g. one at a time and/or serially. Working on dies individually and/or serially, i.e. having numerous sequential processes especially in back end processes, may lead to very high costs. In addition to the costs for serial processes, additional costs may further arise due to multiple electrical tests. Furthermore, interruption of the supply chain may further add to the complexity of logistics.

SUMMARY

Various embodiments provide a method for manufacturing a chip package, the method including: holding a carrier including a plurality of dies; forming a separation between the plurality of dies by removing from the carrier one or more portions of the carrier between the plurality of dies; forming an encapsulation material in the removed one or more portions between the plurality of dies; and separating the dies through the encapsulation material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a standard supply chain diagram;

FIG. 2 shows a diagram of a supply chain according to an embodiment;

FIG. 3 shows a method for manufacturing a chip package according to an embodiment;

FIGS. 4A to 4E show a method for manufacturing a chip package according to an embodiment;

FIGS. 5A to 5F shows a method for manufacturing a chip package according to an embodiment;

FIG. 6 shows a method for manufacturing a chip package according to an embodiment;

FIG. 7 shows a chip package according to an embodiment.

DESCRIPTION

Figure 4D:
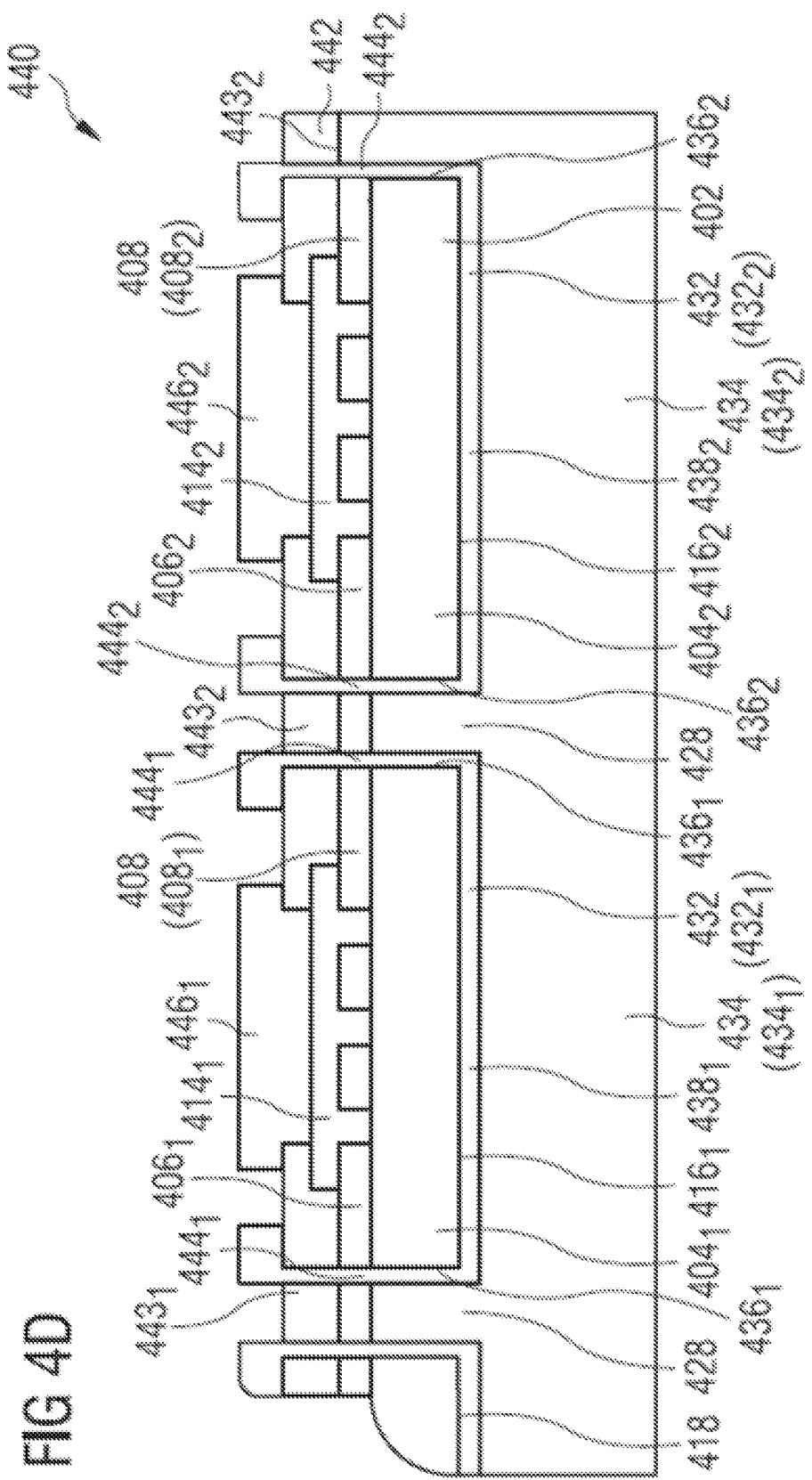

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide a method for manufacturing a chip package wherein one or more are all processes may be performed on the silicon wafer, e.g. without individualizing chips before a final chip package is produced.

Various embodiments provide a method for manufacturing a chip package wherein single processes, i.e. single processes wherein individual chips and/or devices may be worked on individually and separately from each other, may be eliminated. Typical processes as used in wafer manufacturing processes may be used. Performance of the entire workflow may be carried out in cleanroom atmosphere, so that high requirements with respect to defect density may be realized.

Various embodiments provide a method for manufacturing a chip package, wherein the complete production of ultra thin semiconductor components within a housing (See FIG. 2, processes 210 to 240) may be carried out at wafer level. In other words, the entire manufacturing process, e.g. wafer preparation (in 210), die formation and front end processes (in 220), chip interconnection (in 230) and die molding (in 240), may take place with silicon manufacturing equipment, wherein parallel processing at wafer level is possible. Parallel processing may be understood to mean that instead of each die being separated and/or wherein process may be carried out on each die one at time and/or one after the other, processes, e.g. each of processes 210 to 240, may each be carried out on a plurality of dies together, e.g. in a batch process, e.g. at the same time. Particularly, contact and wiring metallization to chip top side with additional function of electromagnetic shielding can be realized immediately on silicon. The method may be used for components with or without back side metallization.

FIG. 3 shows method 300 for manufacturing a chip package according to an embodiment. Method 300 may include:

holding a carrier including a plurality of dies (in 310);

forming a separation between the plurality of dies by removing from the carrier one or more portions of the carrier between the plurality of dies (in 320);

forming an encapsulation material in the removed one or more portions between the plurality of dies (in 330); and separating the dies through the encapsulation material (in 340).

FIG. 4 shows method 400 for manufacturing a chip package according to an embodiment.

Carrier 402 may include a semiconductor wafer, e.g. a raw semiconductor wafer. The wafer substrate may include at least one from the following group of materials, the group of materials consisting of: Silicon, Germanium, Group III to V materials, polymers. According to an embodiment, the wafer substrate may include doped or undoped silicon. According to another embodiment, the wafer substrate may include a silicon on insulator SOI wafer. According to an embodiment, the wafer substrate may include a semiconductor compound material, e.g. gallium arsenide (GaAs), indium phosphide (InP). According to an embodiment, the wafer substrate may include a quaternary semiconductor compound material, e.g. indium gallium arsenide (InGaAs).

Carrier 402, e.g. the wafer substrate, may have a thickness $t_w$ (from top side to bottom side) ranging from about 250 μm to about 950 μm, e.g. from about 300 μm to about 750 μm, e.g. from about 400 μm to about 650 μm. The wafer may have a diameter ranging from about 25 mm to about 450 mm, e.g. about 100 mm, to about 350 mm, e.g. about 200 mm to about 300 mm.

One or more electronic circuits may be formed within the dies in a front end process, e.g. over a front side of the semiconductor wafer. The front end process may include a front end of line FEOL process, wherein processes may be carried out to form the active electrical components of the semiconductor device, e.g. forming a source region, e.g. forming a drain region, e.g. forming a channel region. Front end processes may normally be carried out at carrier top side 406, wherein one or more electronic circuits $413_1$, $413_2$, $413_3$... $413_n$ may be formed at carrier top side 412. An FEOL process may be followed by a back end of line BEOL process, wherein metallization, e.g. wiring, may be formed to electrically connect the active electrical components of the semiconductor device.

Following FEOL and BEOL processes, carrier 402 may include a semiconductor wafer, and may include many semiconductor dies, e.g. a plurality of dies $404_1$, $404_2$, $404_3$... $404_n$ formed in the semiconductor wafer.

Carrier 402 including a plurality of dies is shown in FIG. 4A to include two dies $404_1$ and $404_2$. However, a plurality of dies is not limited to two dies and may include one or more dies, e.g. two, three, four, five, six, seven, eight, nine, ten or even more dies such as tens, hundreds or thousands of dies. Each of the dies may be referred to as a chip, e.g. a semiconductor chip. Each die $404_1$, $404_2$, e.g. each semiconductor chip, may include at least part of carrier 402, e.g. the wafer substrate.

Following FEOL and BEOL processes, a passivation layer 408 may be formed over a carrier top side 406, i.e. directly on carrier top side 406 (in other words, the passivation layer 408 may be formed to be in physical contact with the carrier top side 406). As may be seen in the following Figures, the carrier top side 406 may include a plurality of die top sides $406_1$, $406_2$, $406_3$, $406_4$... $406_n$. Passivation layer 408 may have a thickness $t_p$ ranging from about 20 nm to about 20 μm, e.g. from about 50 nm to about 10 μm, e.g. from about 1 μm to about 5 μm.

One or more contact pads $414_1$, $414_2$, $414_3$, $414_4$... $414_n$ or electrical contacts, may be formed through and/or over passivation layer 408 i.e. over carrier top side 406.

It may be understood, one or more electronic circuits $413_1$, $413_2$, $413_3$... $413_n$ formed at carrier top side 406 may be arranged within defined die regions $404_1$, $404_2$, $404_3$... $404_n$.

Plurality of dies $404_1$, $404_2$, $404_3$... $404_n$ may be commonly held by passivation layer 408. Regions between the die regions, e.g. between plurality of dies $404_1$, $404_2$, $404_3$... $404_n$, e.g. between neighboring dies may include excess regions 422, which are not necessary for the functioning of the die. The excess regions between plurality of dies $404_1$, $404_2$, $404_3$... $404_n$ may be referred to as kerf regions. Usually, kerf regions may be used as sawing regions, and may be sawed or diced through to separate dies, e.g. individualizing dies from each other. However these methods of sawing and dicing through the wafer to separate the dies may be avoided according to various embodiments.

To form one or more contact pads $414_1$, $414_2$, $414_3$, $414_4$... $414_n$ or electrical contacts, first, one or more through-holes may be formed through passivation layer 408, e.g. within each die region. Subsequently, electrically conductive material may be formed, e.g. deposited in the one or more through-holes, wherein the electrically conductive material may electrically contact the dies, e.g. the electronic circuits formed in the die regions.

Generally, each die $404_1$, e.g. each die region, may include one or more electronic circuits formed within the die, e.g. at a die top side $406_1$. Furthermore, each die $404_1$, e.g. each die region, may include passivation layer formed over die top side $406_1$, and one or more through-holes formed through the passivation layer. Each die $404_1$, may further include electrically conductive material formed in the one or more through-holes, and one or more contact pads $414_1$ in electrically connection with the electrically conductive material.

As carrier 402 and a plurality of dies $404_1$, $404_2$, $404_3$... $404_n$ in carrier 402 may be manufactured in a batch process, it may be understood that one or more contact pads $414_1$, $414_2$, $414_3$, $414_4$... $414_n$ or electrical contacts, may be formed over top sides $406_1$, $406_2$, $406_3$, $406_4$... $406_n$, e.g. by forming one or more through-holes through the passivation layer and forming electrically conductive material in the one or more through-holes in a parallel process. One or more contact pads $414_1$, $414_2$, $414_3$, $414_4$... $414_n$ may be electrically connected to plurality of dies $404_1$, $404_2$, $404_3$... $404_n$ in a common process, e.g. a parallel process.

It may also be understood that one or more contact pads $414_1$, $414_2$, $414_3$, $414_4$... $414_n$ may also be formed within defined die regions $404_1$, $404_2$, $404_3$... $404_n$, and therefore, each die, e.g. each die region $404_1$, may include one or more electronic circuits $413_1$ and one or more contact pads $414_1$ formed at die top side $406_1$. Carrier 402 may include a plurality of dies $404_1$, $404_2$, $404_3$... $404_n$, wherein each die $404_1$, $404_2$, $404_3$... $404_n$, may include a die region including one or more electronic circuits formed at the die top sides $406_1$, $406_2$, $406_3$, $406_4$... $406_n$.

Top sides $406_1$, $406_2$, $406_3$, $406_4$... $406_n$ may face a direction substantially opposite to a direction which bottom sides $416_1$, $416_2$, $416_3$, $416_4$... $416_n$ face.

Bottom sides $416_1$, $416_2$, $416_3$, $416_4$... $416_n$ may be understood to refer to sides of plurality of dies $404_1$, $404_2$, $404_3$... $404_n$ which may be generally free from metallization or contact pads or electrical contacts. However, with respect to power semiconductor devices, bottom sides $416_1$, $416_2$, $416_3$, $416_4$... $416_n$ may be provided with a back contact formed over the bottom side, wherein a vertical current flow may be supported between a top side of the die and a bottom side of the die. Bottom sides $416_1$, $416_2$, $416_3$, $416_4$... $416_n$ of plurality of dies $404_1$, $404_2$, $404_3$... $404_n$ may be formed on the same side as a carrier bottom side 418

Top sides $406_1$, $406_2$, $406_3$, $406_4$... $406_n$ may also be referred to as a "first side", "front side" or "upper side" of plurality of dies $404_1$, $404_2$, $404_3$ ... $404_n$. The terms "top side", "first side", "front side" or "upper side" may be used interchangeably hereinafter. Bottom sides $416_1$, $416_2$, $416_3$, $416_4$ ... $416_n$ may also be referred to as "second side" or "back side" of plurality of dies $404_1$, $404_2$, $404_3$ ... $404_n$. The terms "second side", "back side", or "bottom side" may be used interchangeably hereinafter.

Carrier 402 including plurality of dies $404_1$, $404_2$, $404_3$ ... $404_n$ may be held, e.g. from a first side, e.g. from top side 406 of carrier 402. It may be understood that carrier top side 406 may include top sides $406_1$, $406_2$, $406_3$, $406_4$ ... $406_n$ of plurality of dies $404_1$, $404_2$, $404_3$ ... $404_n$.

In 420, adhesion material 424 may be deposited over a side, e.g. side 406 of carrier 402, and carrier 402 and plurality of dies $404_1$, $404_2$, $404_3$ ... $404_n$ may be adhered to supporting structure 426 via adhesion material 424. Adhesion material 424 may be deposited over carrier top side 406 wherein adhesion material 424 may be formed over one or more top side electrically conductive pads $414_1$, $414_2$, $414_3$, $414_4$ ... $414_n$ formed over top sides $406_1$, $406_2$, $406_3$, $406_4$ ... $406_n$ of plurality of dies $404_1$, $404_2$, $404_3$ ... $404_n$.

Adhesion material 424 may have a thickness $t_a$ ranging from about 0.5 µm to about 10 µm, e.g. from about 1 µm to about 10 µm, e.g. from about 2 µm to about 5 µm.

Supporting structure 426 may include at least one from the following group of materials, the group consisting of: plastic, glass, silicon, e.g. supporting structure 426 may include e.g. a plastic wafer, e.g. a glass wafer, e.g. a silicon wafer.

Plurality of dies $404_1$, $404_2$, $404_3$ ... $404_n$ may be commonly held by adhesion material 424. Supporting structure 426 may provide a substantially level supporting structure over which carrier 402 may be held, and to which plurality of dies $404_1$, $404_2$, $404_3$ ... $404_n$ may be adhered. Plurality of dies $404_1$, $404_2$, $404_3$ ... $404_n$ may be held from first side, i.e. top sides $406_1$, $406_2$, $406_3$, $406_4$ ... $406_n$ of the plurality of dies $404_1$, $404_2$, $404_3$ ... $404_n$.

Subsequently, thinning of carrier 402 may be carried out from a carrier second side 418, wherein second carrier side faces a direction opposite to a direction that first carrier side, i.e. carrier top side 406 faces. In other words, thinning of carrier 402 may be carried by removing one or more regions 422 of plurality of dies $404_1$, $404_2$, $404_3$ ... $404_n$ from a side 418 of carrier 402 opposite to side 412 being held.

Thinning of carrier 402 may include carrying out grinding and/or plasma etching and/or chemical etching, to thin carrier 402. As carrier 402 is thinned, plurality of dies $404_1$, $404_2$, $404_3$ ... $404_n$ may be thinned as well. Thinning may be carried out wherein a top to bottom side thickness of the plurality of dies and/or the carrier, may be reduced to a thickness $t_t$ less than 100 µm. Thickness $t_t$ may range from about 5 µm to about 400 µm, e.g. about 20 µm to about 100 µm, e.g. about 30 µm to about 80 µm. In other words, ultra-thin chips may be formed by a batch grinding process.

Thinning of carrier 402 may be carried out such that back side 418 is substantially planar, e.g. level. In other words, bottom sides $416_1$, $416_2$, $416_3$, $416_4$ ... $416_n$ of plurality of dies $404_1$, $404_2$, $404_3$ ... $404_n$ may also be substantially planar, e.g. level, after a thinning process. It may also be understood that the thinned plurality of dies $404_1$, $404_2$, $404_3$ ... $404_n$ may have a similar thickness to each other.

Up till now, plurality of dies $404_1$, $404_2$, $404_3$ ... $404_n$ may be commonly held via carrier 402. In other words plurality of dies $404_1$, $404_2$, $404_3$ ... $404_n$ may still form part of carrier 402. Subsequently, a separation between plurality of dies $404_1$, $404_2$, $404_3$ ... $404_n$ may be formed by removing from carrier 402 one or more portions 422 of carrier 402 between plurality of dies $404_1$, $404_2$, $404_3$ ... $404_n$. The separation may take place while plurality of dies $404_1$, $404_2$, $404_3$ ... $404_n$ are still being held at their top sides $406_1$, $406_2$, $406_3$, $406_4$ ... $406_n$ by at least one of adhesion material 424, passivation layer 408 and/or supporting structure 426.

A masking process, e.g. depositing a photoresist mask, may be used to protect, e.g. to shield, plurality of dies $404_1$, $404_2$, $404_3$ ... $404_n$ from a kerf removal process, and to expose one or more portions 422, i.e. kerf regions, to the removal process. One or more portions 422 of carrier 402 between plurality of dies $404_1$, $404_2$, $404_3$ ... $404_n$ may be removed selectively using a plasma etching process and/or a chemical etching process.

Once kerf regions 422 are removed, removed one or more portions 428, e.g. separation spaces, may be left between plurality of dies $404_1$, $404_2$, $404_3$ ... $404_n$, e.g. between at least one die, e.g. $404_1$ and at least one neighboring die, e.g. $404_2$. Plurality of dies $404_1$, $404_2$, $404_3$ ... $404_n$ may be separated from each other, e.g. as the kerf regions may be removed. However, plurality of dies $404_1$, $404_2$, $404_3$ ... $404_n$ may still be commonly held by at least one of adhesion material 424 and/or passivation layer 408 and/or supporting structure 426.

In 430, electrically conductive layer 432 may be deposited over a second side of the plurality of dies, e.g. bottom sides $416_1$, $416_2$, $416_3$, $416_4$ ... $416_n$, before forming encapsulation material 434 in removed one or more portions 428 between plurality of dies $404_1$, $404_2$, $404_3$ ... $404_n$. Electrically conductive layer 432 may be deposited over one or more sidewalls $436_1$, $436_2$, $436_3$ ... $436_n$ of plurality of dies $404_1$, $404_2$, $404_3$ ... $404_n$ before forming encapsulation material 434 in removed one or more portions 428 between plurality of dies $404_1$, $404_2$, $404_3$ ... $404_n$. One or more sidewalls $436_1$, $436_2$ of plurality of dies $404_1$, $404_2$, $404_3$ ... $404_n$ may include sides of plurality of dies $404_1$, $404_2$, $404_3$ ... $404_n$ extending between die top sides $406_1$, $406_2$, $406_3$, $406_4$ ... $406_n$ and die bottom sides $416_1$, $416_2$, $416_3$, $416_4$ ... $416_n$. Electrically conductive layer 432, e.g. portion $432_1$ of electrically conductive layer 432 deposited over a bottom side $416_1$ of a die $406_1$, may be electrically connected to a contact pad $438_1$ formed over a bottom side $416_1$ of a die $406_1$. Similarly, electrically conductive layer 432, e.g. portion $432_2$ of electrically conductive layer 432 deposited over a bottom side $416_2$ of a die $406_2$, may be electrically connected to a contact pad $438_2$ formed over a bottom side $416_2$ of a die $406_2$, and so forth for one or more or all the dies. Contact pad $438_1$ may include an electrical contact for one or more electronic circuits formed in the die, e.g. a drain region for a power semiconductor device.

According to an embodiment, one or more electronic circuits formed in die $406_1$ may include a power transistor, which may include one or more contact pads $414_1$ on die top side $406_1$, the one or more contact pads $414_1$ being in electrical connection with e.g. a first source/drain region and/or a gate region at die top side $406_1$, and further electrically contacted to contact pad $438_1$ formed over a die bottom side $416_1$, wherein contact pad $438_1$ may be in electrical connection with e.g. a second source/drain region.

It may be understood that electrically conductive layer 432 may also include one or more portions 432r of electrically conductive layer deposited over passivation layer 408, e.g. from back side 418 of carrier 402, between plurality of dies $404_1$, $404_2$. These one or more portions of electrically conductive layer 432r may remain in the final chip package Alternatively, these one or more portions of electrically conductive layer 432r may be removed from the final chip package as described in Method 500.

It may be understood that method 400 may not only be limited to manufacturing a chip package for power semiconductor chips, but may also be used for low power semiconductor chips, e.g. devices capable of carrying up to 100 V to 150 V, e.g. for semiconductor logic device such as an application specific integrated circuit ASIC, a field programmable gate array FPGA, a programmable processor such as e.g. a microprocessor, a driver, a controller, a sensor. In these cases, a bottom side contact $438_1$, may not be necessary, and depositing an electrically conductive layer 432 need not be carried out.

It may be understood that at least one die of plurality of dies $404_1$, $404_2$, $404_3$ . . . $404_n$ may include a power semiconductor device, wherein the power semiconductor device may be capable of carrying a voltage of up to approximately 600 V. It may be understood that at least one die of plurality of dies $404_1$, $404_2$, $404_3$ . . . $404_n$ may include a power semiconductor chip, wherein the power semiconductor chip may include at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

Electrically conductive layer 432 may include at least one from the following group of materials, the group consisting of: copper, nickel, iron, silver, gold, palladium, aluminum, tungsten.

Electrically conductive layer 432 may have a thickness $t_{ec}$ ranging from about 0.5 μm to about 5 μm, e.g. from about 1 μm to about 4 μm.

Encapsulation material 434 may be formed over electrically conductive layer 432. Encapsulation material 434 may be deposited by compression molding. Alternatively, encapsulation material 434 may be deposited by spin coating. Encapsulation material 434 may be formed directly on electrically conductive layer 432. Encapsulation material 434 may be formed over second side, e.g. bottom sides $416_1$, $416_2$, $416_3$, $416_4$ . . . $416_n$, of plurality of dies $404_1$, $404_2$, $404_3$ . . . $404_n$, the second side $416_1$, $416_2$, $416_3$, $416_4$ . . . $416_n$ facing a direction opposite to a direction the first side $406_1$, $406_2$, $406_3$, $406_4$ . . . $406_n$, faces. Encapsulation material 434 may be formed in removed one or more portions 428 between plurality of dies $404_1$, $404_2$, $404_3$ . . . $404_n$. Encapsulation material 434 may be formed over electrically conductive layer 432 in removed one or more portions 428 and/or over bottom sides $416_1$, $416_2$, $416_3$, $416_4$ . . . $416_n$ of plurality of dies $404_1$, $404_2$, $404_3$ . . . $404_n$. Encapsulation material 434 may be formed over one or more sidewalls $436_1$, $436_2$, $436_3$ . . . $436_n$ of plurality of dies $404_1$, $404_2$, $404_3$ . . . $404_n$ in removed one or more portions 428 between plurality of dies $404_1$, $404_2$, $404_3$ . . . $404_n$ and over electrically conductive layer 432 over second side $416_1$, $416_2$, $416_3$, $416_4$ . . . $416_n$ of plurality of dies $404_1$, $404_2$, $404_3$ . . . $404_n$. Encapsulation material 434 may have a thickness tc ranging from about 50 μm to about 200 μm, e.g. from about 70 μm to about 180 μm, e.g. from about 100 μm to about 150 μm.

Encapsulation material 434 may function as a packaging material surrounding and/or protecting at least bottom sides $416_1$, $416_2$, $416_3$, $416_4$ . . . $416_n$ of plurality of dies $404_1$, $404_2$, $404_3$ . . . $404_n$. Furthermore, encapsulation material 434 may function as a supporting carrier, which further commonly holds plurality of dies $404_1$, $404_2$, $404_3$ . . . $404_n$ together in a single supporting carrier. Therefore, plurality of dies $404_1$, $404_2$, $404_3$ . . . $404_n$ may not have to be processed individually.

Encapsulation material 434 may include at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

Subsequently in 440, carrier 402 including plurality of dies $404_1$, $404_2$, $404_3$ . . . $404_n$ may be released from supporting structure 426 after forming encapsulation material 434 in removed one or more portions 428 between plurality of dies $404_1$, $404_2$, $404_3$ . . . $404_n$. Supporting structure 426 and/or adhesion material 424 may further be removed, as plurality of dies $404_1$, $404_2$, $404_3$ . . . $404_n$ may still be commonly held by at least one of passivation layer 408 and/or encapsulation material 434.

As shown in 440, electrically insulating layer 442 may be formed over first side, e.g. top sides $406_1$, $406_2$, $406_3$, $406_4$ . . . $406_n$ of plurality of dies $404_1$, $404_2$, $404_3$ . . . $404_n$ e.g. over at least one of plurality of dies $404_1$, $404_2$, $404_3$ . . . $404_n$.

Electrically insulating layer 442 may have a thickness tc ranging from about 0.5 μm to about 5 μm, e.g. from about 1 μm to about 4 μm.

One or more through-holes $443_1$, $443_2$, $443_3$. . . $443_n$ may be formed through electrically insulating layer 442, over a first side, e.g. a top side $40_{61}$ of at least one $404_1$ of plurality of dies $404_1$, $404_2$, $404_3$. . . $404_n$ and/or through passivation layer 408. Formation of the one or more through-holes may be carried out such that portions of electrically conductive layer 432, may be exposed from front side, e.g. top sides $406_1$, $406_2$, $406_3$, $406_4$. . . $406_n$ of plurality of dies $404_1$, $404_2$, $404_3$. . . $404_n$.

One or more electrical interconnects $444_1$, $444_2$, $444_3$ . . . $444_n$ may be deposited within the one or more through-holes $443_1$, $443_2$, $443_3$ . . . $443_n$. This process may be carried out over plurality of dies $404_1$, $404_2$, $404_3$ . . . $404_n$. Depositing one or more electrical interconnects $444_1$, $444_2$, $444_3$ . . . $444_n$ within the one or more through-holes $443_1$, $443_2$, $443_3$ . . . $443_n$ may include filling the one or more through-holes $443_1$, $443_2$, $443_3$ . . . $443_n$ with electrically conductive material. One or more electrical interconnects $444_1$, $444_2$, $444_3$ . . . $444_n$ may be electrically connected to at least one of plurality of dies $404_1$, $404_2$, $404_3$ . . . $404_n$. For example, one or more electrical interconnects $444_1$ may be electrically connected to die $404_1$, e.g. to one or more top side electrically conductive pads $414_1$ formed over top side $406_1$ of the at least one die, e.g. die $404_1$ of plurality of dies $404_1$, $404_2$, $404_3$ . . . $404_n$. For example, one or more electrical interconnects $444_2$ may be electrically connected to die $404_2$, e.g. to one or more top side electrically conductive pads $414_2$ formed over top side $406_2$ of die $404_2$ of plurality of dies $404_1$, $404_2$, $404_3$ . . . $404_n$, and so forth for one or more or all the dies.

A bottom side 416 to top side 406 electrical interconnection may be formed as a result of deposition of one or more electrical interconnects $444_1$, $444_2$, $444_3$ . . . $444_n$ within the through-holes. At least one electrical interconnect $444_1$ may be electrically connected to electrically conductive layer $432_1$ deposited over second side, e.g. bottom side $416_1$ of plurality of dies $404_1$, $404_2$, $404_3$ . . . $404_n$. For example, at least one electrical interconnect $444_2$ may be electrically connected to electrically conductive layer $432_2$ deposited over second side, e.g. bottom side $416_2$ of plurality of dies $404_1$, $404_2$, $404_3$ ... $404_n$, and so forth for one or more or all the dies.

It may be understood that each of one or more electrical interconnects $444_1$, $444_2$, $443_3$ ... $444_n$ may each further include at least one electrically conductive portion $446_1$, $446_2$, $446_3$ ... $446_n$ formed above electrically insulating material 442. Electrically conductive portion $446_1$, $446_2$, $446_3$ ... $446_n$ may be referred to as a redistribution layer, which may be electrically connected to one or more top side contact pads $414_1$, $414_2$, $414_3$, $414_4$ ... $414_n$ and may restructure the spatial layout of the contact pads.

Subsequently, as shown in 450, further encapsulation material $448_1$, $448_2$, $448_3$, $448_4$ ... $448_n$ may be deposited over top sides $406_1$, $406_2$, $406_3$, $406_4$ ... $406_n$ of plurality of dies $404_1$, $404_2$, $404_3$ ... $404_n$. Further encapsulation material $448_1$, $448_2$, $448_3$, $448_4$ ... $448_n$ may function to planarize a top side of the chip package.

Subsequently, the dies may be separated through encapsulation material 434. This may be carried out by dicing through encapsulation material 434 in one or more portions 428, e.g. separation spaces, between plurality of dies $404_1$, $404_2$, $404_3$ ... $404_n$, e.g. between at least one die, e.g. die $404_1$ and at least one neighboring die, e.g. $404_2$. Plurality of dies $404_1$, $404_2$, $404_3$ ... $404_n$ may be separated through encapsulation material 434 and electrically insulating layer 442 in one or more portions 428, e.g. separation spaces, between plurality of dies $404_1$, $404_2$, $404_3$ ... $404_n$.

Individual chip packages $401_1$, $401_2$, $401_3$ ... $401_n$ may therefore be separated from each other.

According to an embodiment, each chip package, e.g. chip package $401_1$ may include: a chip, e.g. die $404_1$; passivation layer $408_1$ formed over chip front side $406_1$, chip front side $406_1$ including one or more electrical pads $414_1$; an electrically conductive layer $432_1$ formed over a chip back side $416_1$ and over at least one side wall $436_1$ of chip $404_1$; encapsulation material 434 formed over electrically conductive layer $432_1$; at least one through-hole $443_1$ formed through passivation layer $408_1$; and electrically conductive material $444_1$ formed within through-hole $443_1$; wherein electrically conductive material $444_1$ in through-hole $443_1$ may be electrically connected to electrically conductive layer $432_1$.

According to an embodiment, each chip package, e.g. chip package $401_1$ may further include electrically insulating layer $442_1$ formed over passivation layer $408_1$, and wherein at least one through-hole $443_1$ may be formed through passivation layer $408_1$ and electrically insulating layer $442_1$.

Figure 5A:
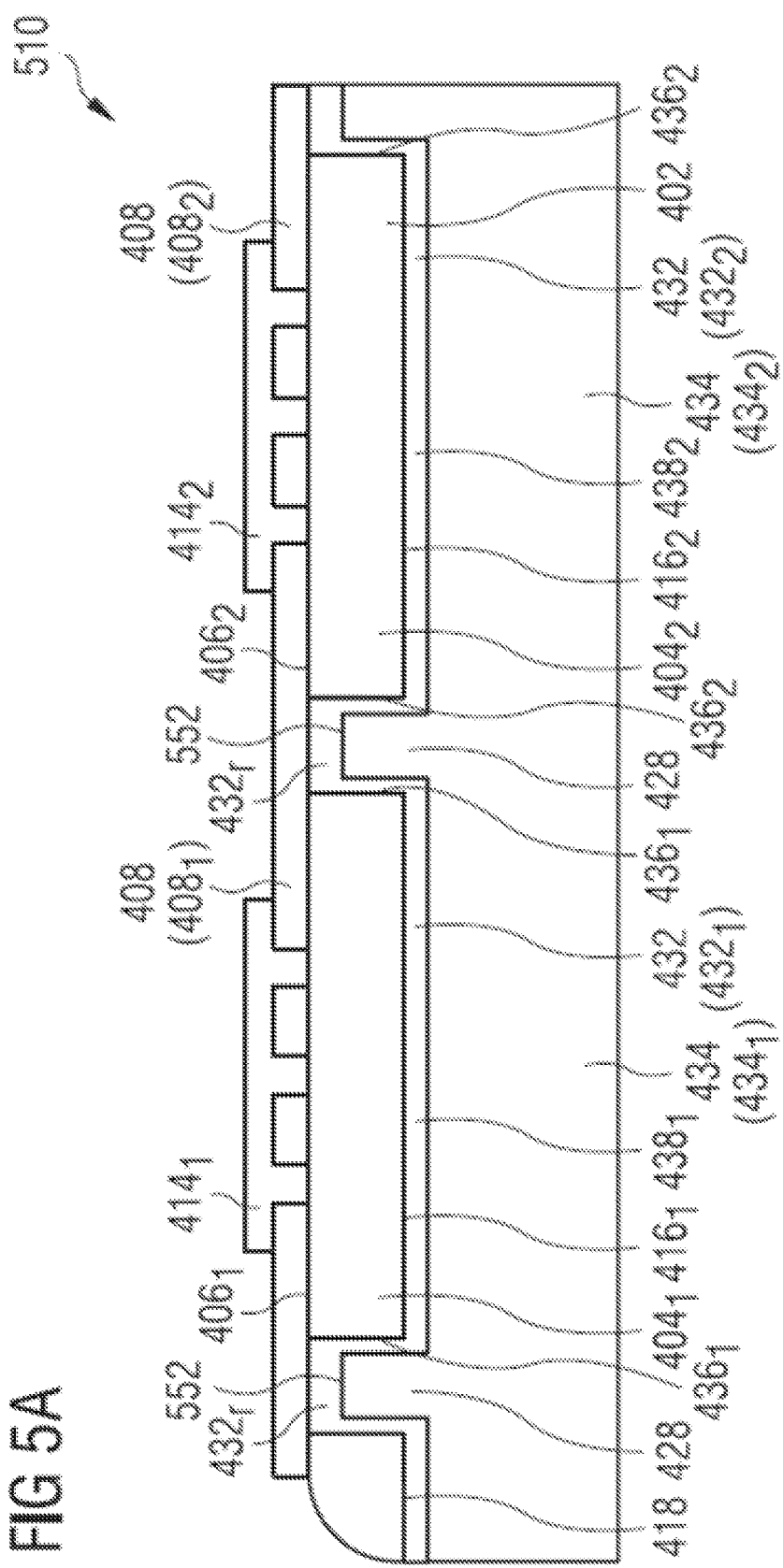
Figure 5F:
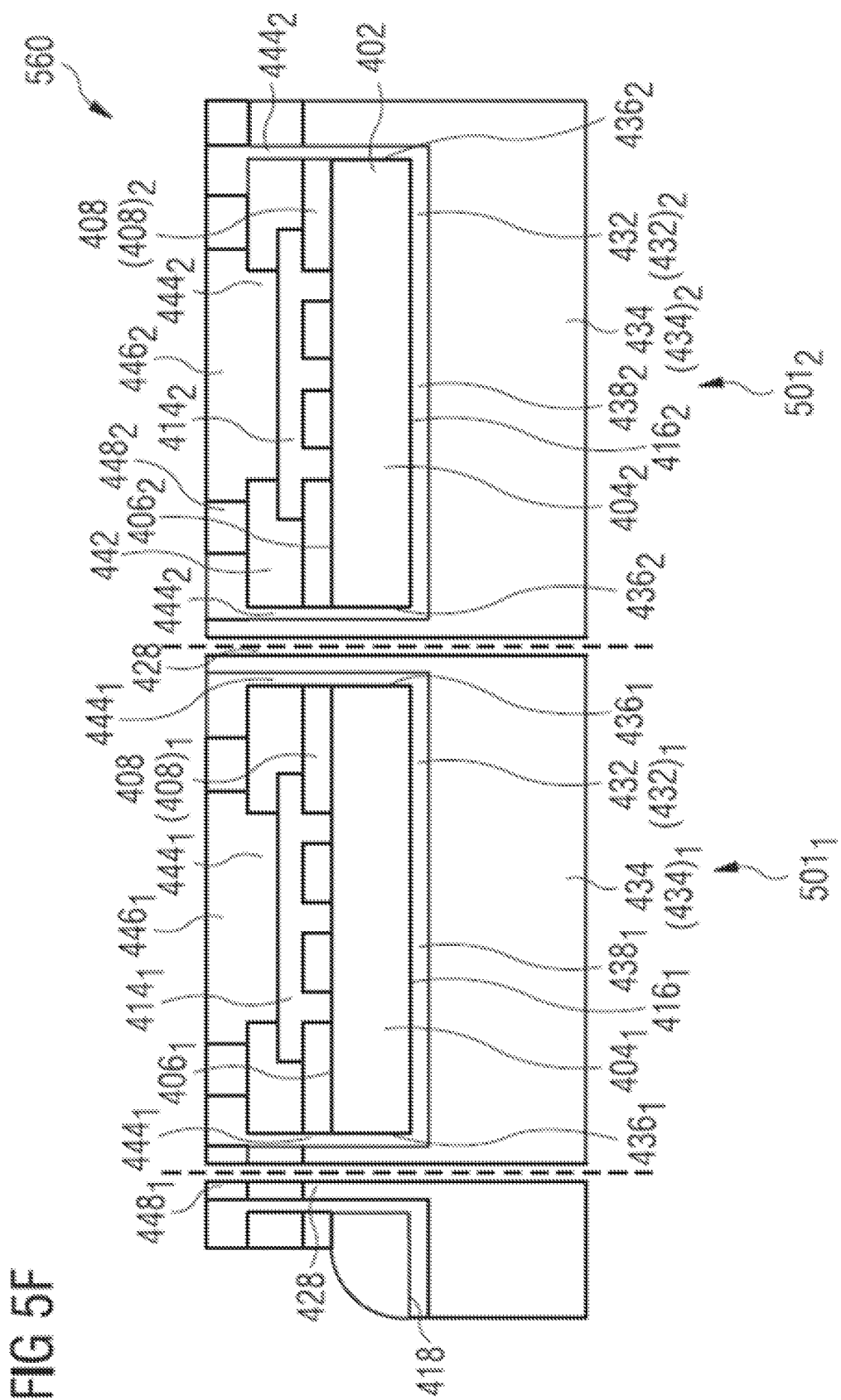

FIG. 5 shows method 500 for manufacturing a chip package according to an embodiment. Method 500 shows a series of processes for electrically connecting one or more electrical interconnects $444_1$, $444_2$, $4_{443}$ ... $444_n$ to electrically conductive layer 432 deposited over second side, e.g. bottom sides $416_1$, $416_2$, $416_3$, $416_4$ ... $416_n$ of plurality of dies $404_1$, $404_2$.

Method 500 may include one or more or all of the processes already described with respect to method 400. Method 500 may include one or more or all of the processes 310, 420, 430, 440, 450 as already described with respect to method 400. Method 500 may further include one or more intermediate processes, which may be carried out between and/or may include processes 440 and 450.

In 510, similarly to process 440, carrier 402 including plurality of dies $404_1$, $404_2$, $404_3$ ... $404_n$ may be released from supporting material 426 after forming encapsulation material 434 in removed one or more portions 428 between plurality of dies $404_1$, $404_2$, $404_3$ ... $404_n$. Supporting structure 426 and/or adhesion material 424 may further be removed, as plurality of dies $404_1$, $404_2$, $404_3$ ... $404_n$ may be commonly held by at least one of passivation layer 408 and/or encapsulation material 434. FIG. 5A shows carrier 402 including plurality of dies $404_1$, $404_2$, $404_3$ ... $404_n$ with supporting structure 426 and adhesion material 424 removed.

One or more portions 552 of passivation layer 408 may be selectively removed, e.g. chemically etched and/or plasma etched, from carrier front side 406. Furthermore, one or more portions $432r$ of electrically conductive layer 432 may be removed, e.g. chemically etched and/or plasma etched, from carrier front side 406, either in a same process or in a separate process. The removed one or more portions 552 of passivation layer 408 and removed one or more portions $432r$ of electrically conductive layer 432 may lie between plurality of dies $404_1$, $404_2$, $404_3$ ... $404_n$, e.g. between at least one die, e.g. $404_1$ and at least one neighboring die, e.g. $404_2$. As shown in 520, removal of one or more portions $432r$ of electrically conductive layer 432 and one or more portions 552 of passivation layer 408 between plurality of dies $404_1$, $404_2$, $404_3$ ... $404_n$ may result encapsulation material 434 between plurality of dies $404_1$, $404_2$, $404_3$ ... $404_n$ being exposed from a front side 406.

In 530, electrically insulating layer 442 may be formed over first side, e.g. top sides $406_1$, $406_2$, $406_3$, $406_4$ ... $406_n$ of plurality of dies $404_1$, $404_2$, $404_3$ ... $404_n$, e.g. over at least one of plurality of dies $404_1$, $404_2$, $404_3$ ... $404_n$, as already described with respect to process 440 in method 400. Electrically insulating layer 442 may further be formed in the removed one or more portions 552 of passivation layer 408 and removed one or more portions $432r$ of electrically conductive layer 432. Electrically insulating layer 442 may cover top side 406 of carrier 402 and top sides $406_1$, $406_2$, $406_3$, $406_4$ ... $406_n$ of plurality of dies $404_1$, $404_2$, $404_3$ ... $404_n$.

In 540, one or more through-holes $443_1$, $443_2$, $443_3$ ... $443_3$, may be formed through electrically insulating layer 442, over a first side, e.g. a top side $406_1$ of at least one $404_1$ of plurality of dies $404_1$, $404_2$, $404_3$ ... $404_n$ and/or passivation layer 408 as already described with respect to process 440 in method 400. Formation of the one or more through-holes $443_1$, $443_2$, $443_3$ ... $443_n$, may be carried out such that portions of electrically conductive layer 432, may be exposed from front side, e.g. top sides $406_1$, $406_2$, $406_3$, $406_4$ ... $406_n$ of plurality of dies $404_1$, $404_2$, $404_3$ ... $404_n$.

In 550, one or more electrical interconnects $444_1$ may be deposited within the one or more through-holes as already described with respect to process 440 in method 400.

In 560, further encapsulation material $448_1$, $448_2$, $448_3$, $448_4$ ... $448_n$ may be deposited over top sides $406_1$, $406_2$, $406_3$, $406_4$ ... $406_n$ of plurality of dies $404_1$, $404_2$, $404_3$ ... $404_n$ as described with respect to process 450 of method 400.

Subsequently, the dies may be separated through encapsulation material 434, e.g. through encapsulation material 434 and electrically insulating layer 442 in one or more portions 428, e.g. separation spaces, between plurality of dies $404_1$, $404_2$, $404_3$ ... $404_n$ as described with respect to process 550 of method 400.

Individual chip packages $501_1$, $501_2$, $501_3$ ... $501_n$ may therefore be separated from each other. Individual chip packages $501_1$, $501_2$, $501_3$ ... $501_n$ may each include one or more or all of the features already described with respect to chip package $401_1$, $401_2$, $401_3$ ... $401_n$.

FIG. 6 shows method 600 for manufacturing a chip package, e.g. chip package 401₁, 501₁ according to an embodiment.

Method 600 may include:

holding a wafer including a plurality of dies (in 610);

forming separation regions between plurality of dies by removing one or more portions of the wafer between the plurality of dies (in 620);

forming a mold material in the removed one or more portions between the plurality of dies (in 630); and separating the dies through the mold material (in 640).

Method 600 may include:

holding a wafer, e.g. carrier 402 including a plurality of dies, e.g. $404_1$, $404_2$, $404_3$ ... $404_n$ (in 610);

forming separation regions between plurality of dies $404_1$, $404_2$, $404_3$ ... $404_n$ by removing one or more portions 422 of the wafer between the plurality of dies $404_1$, $404_2$, $404_3$ ... $404_n$ (in 620);

forming a mold material, e.g. encapsulation material 434 in the removed one or more portions 422 between the plurality of dies $404_1$, $404_2$, $404_3$ ... $404_n$ (in 630); and separating the dies $404_1$, $404_2$, $404_3$ ... $404_n$ through the mold material (in 640).

FIG. 7 shows a chip package 701 according to an embodiment.

Chip package 701 may further include one or more or all of the features already described with respect to at least one of chips packages 401, 501.

Chip package 701 may include: a chip, e.g. $404_1$; an electrically insulating layer $408_1$ formed over a first chip side $406_1$, the first chip side $406_1$ including one or more contact pads $414_1$; an electrically conductive layer $432_1$ formed over a second chip side $416_1$ and over a chip side wall $436_1$; a mold material $434_1$ formed over the electrically conductive layer $432_1$; at least one through-hole $443_1$ formed through the electrically insulating layer $408_1$; and an electrical interconnect $444_1$ formed within the through-hole $443_1$; wherein the electrical interconnect $444_1$ in the through-hole $443_1$ may be electrically connected to the electrically conductive layer $432_1$.

It may be understood that various embodiments provide a method for manufacturing a chip package wherein one or more or all processes may be performed on a connected wafer slice. In other words, the processes may be performed wherein a plurality of dies, instead of being processed individually, and separately from each other, may instead be connected within a single carrier, e.g. a wafer. The size of the wafer, e.g. carrier, allows the plurality of dies to be carried altogether, when handling the entire wafer. Processing time may be reduced.

Through parallel processes, in other words by carrying out processes wherein the plurality of dies may be subject to a batch process together, a reduction in the number of variations may be achieved compared to serial processes, wherein each die may be processed individually and in separate processes from each other. Manufacturing of the chip package may be clearly improved. Improved reliability may be achieved due to fewer process fluctuations during the component production.

Thermal and electrical connection of the chip back side may be directed over the chip sidewalls to the chip front side, and therein, device connection and solder joint may be carried out. Furthermore, the electrically conductive layer formed over the chip back side may be used as an electrical shield.

Protection from environmental influxes and/or changes and or disturbances may be provided through use of an encapsulations material.

According to various embodiments, no may be encapsulation material necessary. Depending on device function and device structure it might not be necessary to have additional encapsulation. Encapsulation can be integrated easily.

Various embodiments provide a method for manufacturing a chip package, wherein conventional mechanical sawing of the chips may not be necessary, and instead plasma dicing may be used in to individualize ultra thin chips.

Various embodiments provide a method for manufacturing a chip package, wherein alternatively a pick and place process, may be carried out, e.g. after die separation. However, this may mean that cost intensive serial processes would once again be necessary.

Various embodiments provide a method for manufacturing a chip package, the method including: holding a carrier including a plurality of dies; forming a separation between the plurality of dies by removing from the carrier one or more portions of the carrier between the plurality of dies; forming an encapsulation material in the removed one or more portions between the plurality of dies; and separating the dies through the encapsulation material.

According to an embodiment, the method further includes forming, before holding the carrier, a passivation layer over a side of the carrier, wherein the plurality of dies are commonly held by the passivation layer.

According to an embodiment, holding a carrier including a plurality of dies includes depositing an adhesion material over a side of the carrier and adhering the carrier and the plurality of dies to a supporting structure via the adhesion material.

According to an embodiment, holding a carrier including a plurality of dies includes depositing an adhesion material over a carrier top side wherein the adhesion material is formed over one or more top side electrically conductive pads formed over top sides of the plurality of dies.

According to an embodiment, the method further includes thinning the carrier including the plurality of dies by removing one or more regions of the plurality of dies from a side of the carrier opposite to a side of the carrier being held.

According to an embodiment, thinning the carrier includes thinning the plurality of dies wherein a top to bottom side thickness of the plurality of dies is reduced to a thickness ranging from about 5 μm to about 400 μm.

According to an embodiment, holding a carrier including a plurality of dies includes holding the plurality of dies from a first side the plurality of dies; and wherein forming an encapsulation material in the removed one or more portions between the plurality of dies includes forming the encapsulation material on a second side of the plurality of dies, the second side facing a direction opposite to a direction the first side faces.

According to an embodiment, the method further includes thinning the carrier including the plurality of dies from the second side of the plurality of dies.

According to an embodiment, forming a separation between the plurality of dies by removing from the carrier one or more portions of the carrier between the plurality of dies includes forming a separation between the plurality of dies by removing from the carrier one or more portions of the carrier between the plurality of dies using a plasma etching process.

According to an embodiment, forming a separation between the plurality of dies by removing from the carrier one or more portions of the carrier between the plurality of dies includes forming a separation between the plurality of dies by removing from the carrier one or more portions of the carrier between the plurality of dies using a chemical etching process.

According to an embodiment, the method further includes depositing an electrically conductive layer over a side of the plurality of dies and further forming the encapsulation material over the electrically conductive layer.

According to an embodiment, the method further includes depositing an electrically conductive layer over a side of the plurality of dies opposite to a side of the carrier being held, and further forming the encapsulation material over the electrically conductive layer.

According to an embodiment, the method further includes depositing an electrically conductive layer over one or more sidewalls of the plurality of dies and further forming the encapsulation material over the electrically conductive layer.

According to an embodiment, depositing an electrically conductive layer over a side of the plurality of dies includes depositing an electrically conductive layer including at least one from the following group of materials, the group consisting of: copper, nickel, iron, silver, gold, palladium, aluminum, tungsten over a second side of the plurality of dies.

According to an embodiment, the method further includes forming the encapsulation material over a bottom side of the plurality of dies, and forming an electrically insulating layer over a top side of the plurality of dies.

According to an embodiment, the method further includes forming one or more through-holes through the electrically insulating layer and depositing one or more electrical interconnects within the one or more through-holes.

According to an embodiment, depositing one or more electrical interconnects within the one or more through-holes includes filling the one or more through-holes with electrically conductive material.

According to an embodiment, depositing one or more electrical interconnects within the one or more through-holes includes electrically connecting the one or more electrically interconnects to at least one of the plurality of dies.

According to an embodiment, depositing one or more electrical interconnects within the one or more through-holes includes electrically connecting at least one electrically interconnect to one or more top side electrically conductive pads formed over a top side of the at least one of the plurality of dies.

According to an embodiment, the method further includes depositing one or more electrical interconnects over a top side of the plurality of dies; and electrically connecting at least one electrically interconnect to an electrically conductive layer deposited over a bottom side of the plurality of dies.

According to an embodiment, the method further includes depositing one or more electrical interconnects over a side of the plurality of dies opposite to the electrically conductive layer and the encapsulation material; and electrically connecting at least one electrically interconnect to the electrically conductive layer.

According to an embodiment, the method further includes depositing further encapsulation material over a top side of the plurality of dies before separating the dies through the encapsulation material and the electrically insulating layer.

Various embodiments provide a chip package including: a chip; a passivation layer formed over a chip front side, the chip front side including one or more electrical pads; an electrically conductive layer formed over a chip back side and over at least one side wall of the chip; an encapsulation material formed over the electrically conductive layer; at least one through-hole formed through the passivation layer; and electrically conductive material formed within the through-hole; wherein the electrically conductive material in the through-hole is electrically connected to the electrically conductive layer.

According to an embodiment, the chip package further includes an electrically insulating layer formed over the passivation layer, and wherein the at least one through-hole is formed through the passivation layer and the electrically insulating layer.

Various embodiments provide a method for manufacturing a chip package, the method including: holding a wafer including a plurality of dies; forming separation regions between the plurality of dies by removing one or more portions of the wafer between the plurality of dies; forming a mold material in the removed one or more portions between the plurality of dies; separating the dies through the mold material.

Various embodiments provide a chip package including: a chip; an electrically insulating layer formed over a first chip side, the first chip side including one or more contact pads; an electrically conductive layer formed over a second chip side and over a chip side wall; a mold material formed over the electrically conductive layer; at least one through-hole formed through the electrically insulating layer; and an electrical interconnect formed within the through-hole; wherein the electrical interconnect in the through-hole is electrically connected to the electrically conductive layer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing a chip package, the method comprising:
  forming a plurality of dies from a carrier comprising:
    holding the carrier comprising the plurality of dies, wherein holding the carrier comprising the plurality of dies comprises depositing an adhesion material over a side of the carrier and adhering the carrier and the plurality of dies to a supporting structure via the adhesion material;
    thinning the carrier comprising the plurality of dies by removing one or more regions of the plurality of dies from a side of the carrier opposite to a side of the carrier being held;
    forming a separation between the plurality of dies by removing from the carrier one or more portions of the carrier between the plurality of dies;
  forming an encapsulation material in the removed one or more portions between the plurality of dies; and
  separating the dies through the encapsulation material.

2. The method according to claim 1, further comprising forming, before holding the carrier, a passivation layer over a side of the carrier,
  wherein the plurality of dies are commonly held by the passivation layer.

3. The method according to claim 1,
  wherein holding a carrier comprising a plurality of dies comprises depositing an adhesion material over a carrier top side wherein the adhesion material is formed over one or more top side electrically conductive pads formed over top sides of the plurality of dies.

4. The method according to claim 1, wherein thinning the carrier comprises thinning the plurality of dies wherein a top to bottom side thickness of the plurality of dies is reduced to a thickness ranging from about 5 µm to about 400 µm.

5. The method according to claim 1, wherein holding a carrier comprising a plurality of dies comprises holding the plurality of dies from a first side of the plurality of dies; and
wherein forming an encapsulation material in the removed one or more portions between the plurality of dies comprises forming the encapsulation material on a second side of the plurality of dies, the second side facing a direction opposite to a direction the first side faces.

6. The method according to claim 5, further comprising thinning the carrier comprising the plurality of dies from the second side of the plurality of dies.

7. The method according to claim 1, wherein forming a separation between the plurality of dies by removing from the carrier one or more portions of the carrier between the plurality of dies comprises forming a separation between the plurality of dies by removing from the carrier one or more portions of the carrier between the plurality of dies using a plasma etching process.

8. The method according to claim 1, wherein forming a separation between the plurality of dies by removing from the carrier one or more portions of the carrier between the plurality of dies comprises forming a separation between the plurality of dies by removing from the carrier one or more portions of the carrier between the plurality of dies using a chemical etching process.

9. The method according to claim 1, further comprising: depositing an electrically conductive layer over a side of the plurality of dies and further forming the encapsulation material over the electrically conductive layer.

10. The method according to claim 9, wherein depositing an electrically conductive layer over a side of the plurality of dies comprises
depositing an electrically conductive layer comprising at least one from the following group of materials, the group consisting of: copper, nickel, iron, silver, gold, palladium, aluminum, tungsten over a second side of the plurality of dies.

11. The method according to claim 1, further comprising: depositing an electrically conductive layer over a side of the plurality of dies opposite to a side of the carrier being held, and further forming the encapsulation material over the electrically conductive layer.

12. The method according to claim 11, further comprising depositing one or more electrical interconnects over a side of the plurality of dies opposite to the electrically conductive layer and the encapsulation material; and
electrically connecting at least one electrical interconnect to the electrically conductive layer.

13. The method according to claim 1, further comprising: depositing an electrically conductive layer over one or more sidewalls of the plurality of dies and further forming the encapsulation material over the electrically conductive layer.

14. The method according to claim 1, further comprising forming the encapsulation material over a bottom side of the plurality of dies, and
forming an electrically insulating layer over a top side of the plurality of dies.

15. The method according to claim 14, further comprising forming one or more through-holes through the electrically insulating layer and depositing one or more electrical interconnects within the one or more through-holes.

16. The method according to claim 15, wherein depositing one or more electrical interconnects within the one or more through-holes comprises
filling the one or more through-holes with electrically conductive material.

17. The method according to claim 15, wherein depositing one or more electrical interconnects within the one or more through-holes comprises
electrically connecting the one or more electrical interconnects to at least one of the plurality of dies.

18. The method according to claim 15, wherein depositing one or more electrical interconnects within the one or more through-holes comprises
electrically connecting at least one electrical interconnect to one or more top side electrically conductive pads formed over a top side of the at least one of the plurality of dies.

19. The method according to claim 15, further comprising depositing further encapsulation material over a top side of the plurality of dies before separating the dies through the encapsulation material and the electrically insulating layer.

20. The method according to claim 1, further comprising depositing one or more electrical interconnects over a top side of the plurality of dies; and
electrically connecting at least one electrical interconnect to an electrically conductive layer deposited over a bottom side of the plurality of dies.

21. A method for manufacturing a chip package, the method comprising:
forming a semiconductor wafer comprising a plurality of die regions into a plurality of dies comprising:
holding the semiconductor wafer comprising the plurality of die regions and wherein holding the semiconductor wafer comprising the plurality of die regions comprises depositing an adhesion material over a side of the semiconductor wafer and adhering the semiconductor wafer and the plurality of die regions to a supporting structure via the adhesion material;
thinning the semiconductor wafer comprising the plurality of die regions by removing one or more regions of the plurality of dies from a side of the semiconductor wafer opposite to a side of the semiconductor wafer being held;
forming a separation between the plurality of die regions by removing from the semiconductor wafer one or more portions of the semiconductor wafer between the plurality of die regions to form the plurality of dies;
forming an encapsulation material in the removed one or more portions between the plurality of dies; and
separating the dies through the encapsulation material.

22. A method for manufacturing a chip package, the method comprising:
forming a plurality of dies from a carrier comprising:
holding the carrier comprising the plurality of dies;

forming, before holding the carrier, a passivation layer over a side of the carrier, wherein the plurality of dies are commonly held by the passivation layer;

thinning the carrier comprising the plurality of dies by removing one or more regions of the plurality of dies from a side of the carrier opposite to a side of the carrier being held;

forming a separation between the plurality of dies by removing from the carrier one or more portions of the carrier between the plurality of dies;

forming an encapsulation material in the removed one or more portions between the plurality of dies; and separating the dies through the encapsulation material.

23. A method for manufacturing a chip package, the method comprising:

forming a plurality of dies from a carrier comprising:

holding the carrier comprising the plurality of dies;

thinning the carrier comprising the plurality of dies by removing one or more regions of the plurality of dies from a side of the carrier opposite to a side of the carrier being held;

forming a separation between the plurality of dies by removing from the carrier one or more portions of the carrier between the plurality of dies;

forming an encapsulation material in the removed one or more portions between the plurality of dies;

forming the encapsulation material over a bottom side of the plurality of dies;

forming an electrically insulating layer over a top side of the plurality of dies; and separating the dies through the encapsulation material.

* * * * *